US010120596B2

(12) United States Patent
Resch (10) Patent No.: US 10,120,596 B2
(45) Date of Patent: *Nov. 6, 2018

(54) ADAPTIVE EXTRA WRITE ISSUANCE WITHIN A DISPERSED STORAGE NETWORK (DSN)

(71) Applicant: International Business Machines Corporation, Armonk, NY (US)

(72) Inventor: Jason K. Resch, Chicago, IL (US)

(73) Assignee: International Business Machines Corporation, Armonk, NY (US)

(*) Notice: Subject to any disclaimer, the term of this patent is extended or adjusted under 35 U.S.C. 154(b) by 106 days.

This patent is subject to a terminal disclaimer.

(21) Appl. No.: 15/249,084

(22) Filed: Aug. 26, 2016

(65) Prior Publication Data

US 2017/0060685 A1    Mar. 2, 2017

Related U.S. Application Data

(60) Provisional application No. 62/211,975, filed on Aug. 31, 2015.

(51) Int. Cl.
*G11C 29/00* (2006.01)
*G06F 3/06* (2006.01)
(Continued)

(52) U.S. Cl.
CPC ............ *G06F 3/0619* (2013.01); *G06F 3/064* (2013.01); *G06F 3/067* (2013.01); *G06F 3/0611* (2013.01);
(Continued)

(58) Field of Classification Search
CPC ....... G06F 2212/1008; G06F 2212/657; G06F 11/2094; G06F 2201/805; G06F 2201/82;
(Continued)

(56) References Cited

U.S. PATENT DOCUMENTS 4,092,732 A    5/1978  Ouchi
5,454,101 A    9/1995  Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Guy Lamarre
(74) *Attorney, Agent, or Firm* — Garlick & Markison; Timothy W. Markison; Shayne X. Short (57) ABSTRACT

A computing device includes an interface configured to interface and communicate with a dispersed storage network (DSN), a memory that stores operational instructions, and a processing module operably coupled to the interface and to the memory such that the processing module, when operable within the computing device based on the operational instructions, is configured to perform various operations. For example, the computing device determines storage unit (SU)-based write transfer rates and/or a DSN-based write transfer rate for a write request of encoded data slices (EDSs) to the SUs within the DSN. Then, the computing device processes the SU-based write transfer rates and/or DSN-based write transfer rate to determine characteristics of the various SUs as well as operation of the DSN. The computing device then selectively modifies parameters (e.g., write request time interval) and/or issues additional write request(s) for some or all of the EDSs based on such characteristics.

20 Claims, 7 Drawing Sheets

(51) Int. Cl.

| | | |
|---|---|---|
| *G06F 11/10* | (2006.01) | |
| *G06F 12/14* | (2006.01) | |
| *H04L 29/08* | (2006.01) | |
| *G06F 11/30* | (2006.01) | |
| *G06F 11/34* | (2006.01) | |
| *H03M 13/15* | (2006.01) | |

(52) U.S. Cl.
CPC .......... *G06F 3/0622* (2013.01); *G06F 3/0637* (2013.01); *G06F 3/0644* (2013.01); *G06F 3/0659* (2013.01); *G06F 3/0665* (2013.01); *G06F 3/0689* (2013.01); *G06F 11/1076* (2013.01); *G06F 11/1092* (2013.01); *G06F 11/3034* (2013.01); *G06F 11/3409* (2013.01); *G06F 12/1408* (2013.01); *H04L 67/1097* (2013.01); *G06F 2212/1052* (2013.01); *H03M 13/1515* (2013.01)

(58) Field of Classification Search
CPC .. G06F 9/4856; G06F 11/1092; G06F 3/0622; G06F 11/1096; G06F 11/1076; G06F 3/0619; G06F 3/0623; G06F 3/064; G06F 3/067; G06F 12/0646; H04L 9/0861; H04L 41/0816; H04L 47/803; H04L 63/068; H04L 9/14; H04L 63/08; H04L 63/06; H04L 63/101; H04L 67/1097; H04L 63/0428; H04L 63/0457; H03M 13/3761; H03M 13/1515

See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula | |
| 2005/0132070 A1 | 6/2005 | Redlich et al. | |
| 2005/0144382 A1 | 6/2005 | Schmisseur | |
| 2005/0229069 A1 | 10/2005 | Hassner et al. | |
| 2006/0047907 A1 | 3/2006 | Shiga et al. | |
| 2006/0089997 A1* | 4/2006 | Inokuchi ................. H04L 67/06 709/228 |
| 2006/0136448 A1 | 6/2006 | Cialini et al. | |
| 2006/0156059 A1 | 7/2006 | Kitamura | |
| 2006/0224603 A1 | 10/2006 | Correll | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2012/0311395 A1* | 12/2012 | Leggette ............. G06F 21/6218 714/752 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

(56) References Cited

OTHER PUBLICATIONS

Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

ADAPTIVE EXTRA WRITE ISSUANCE WITHIN A DISPERSED STORAGE NETWORK (DSN)

CROSS REFERENCE TO RELATED PATENTS

The present U.S. Utility Patent Application claims priority pursuant to 35 U.S.C. § 119(e) to U.S. Provisional Application No. 62/211,975, entitled "STORING ENCODED DATA SLICES IN A DISPERSED STORAGE NETWORK," filed Aug. 31, 2015, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Within data storage systems, there may be instances when problems are encountered when attempting to write data for storage therein. For example, noise, error, interference, etc. may all occur and deleteriously affect a write process such that the data is lost or does not get fully or properly written to its intended storage location. The prior art does not provide an adequate means by which these and related problems may be addressed. For example, when a write operation encounters problems, errors, or failure for any reason, one prior art approach is to reissue a command for the write operation. This can significantly decrease the overall operation of such data storage systems by significantly increasing the network traffic within such data storage systems. Also, such a reissue of a command for the write operation may unfortunately be made while the original command for the write operation is still pending further degrading the performance of such data storage systems as well as increasing the network traffic within such data storage systems. The prior art does not provide means for fully effective or efficient handling of such situations.

DETAILED DESCRIPTION OF THE INVENTION

Figure 1:
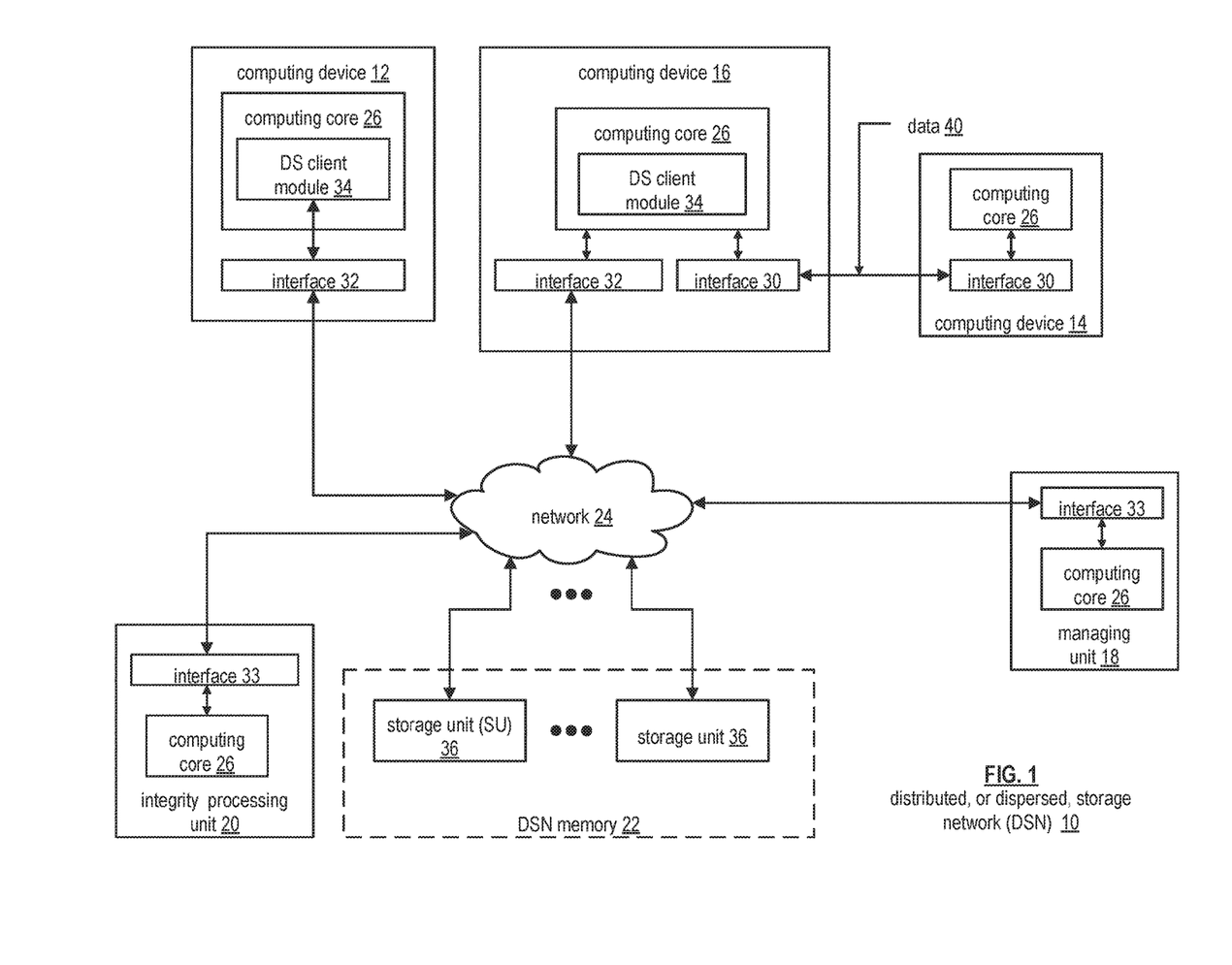
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
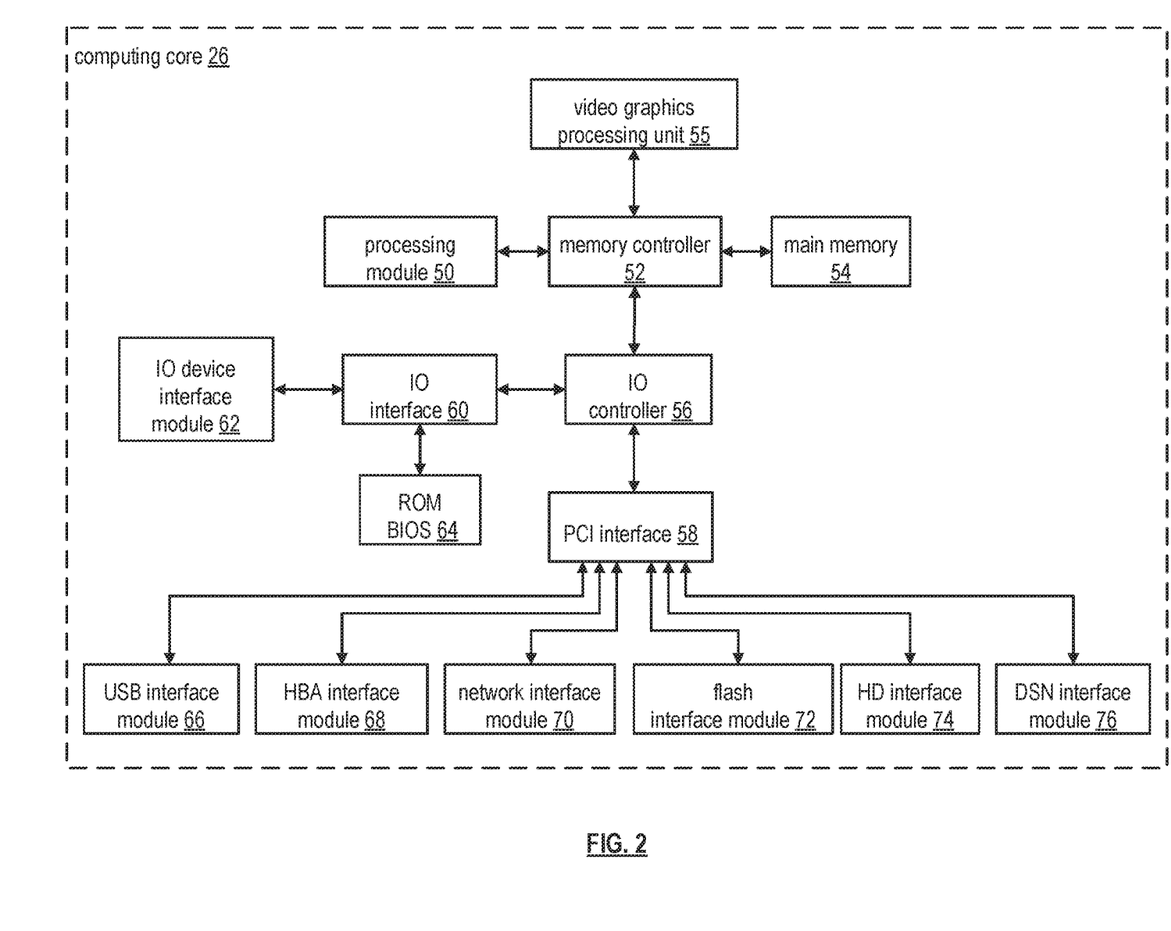
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN module 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figure 3:
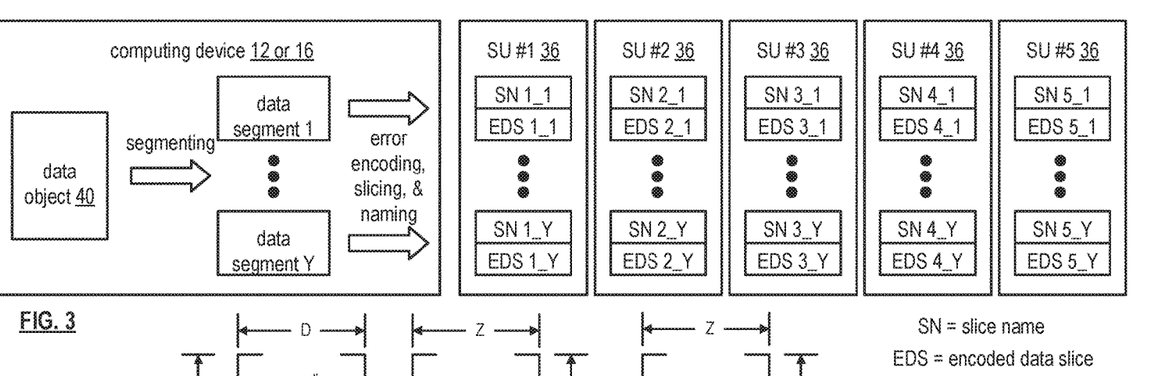
FIG. 3 is a schematic block diagram of an example of dispersed storage error encoding of data in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figures 4, 5:
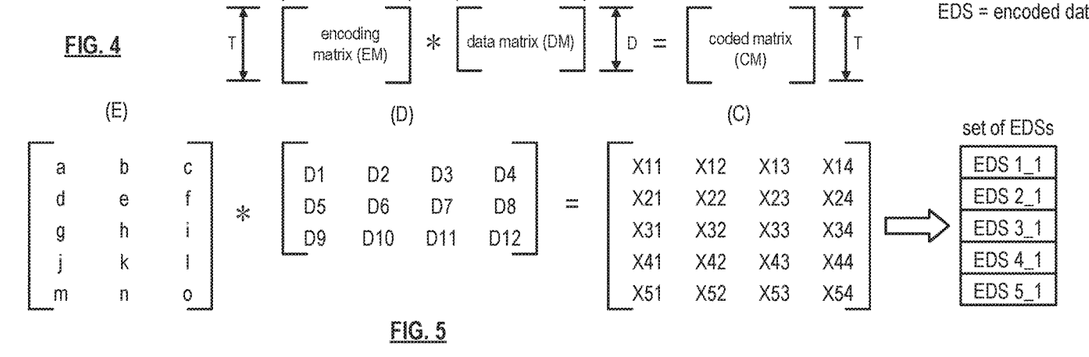
FIG. 4 is a schematic block diagram of a generic example of an error encoding function in accordance with the present invention.
FIG. 5 is a schematic block diagram of a specific example of an error encoding function in accordance with the present invention.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Figure 6:
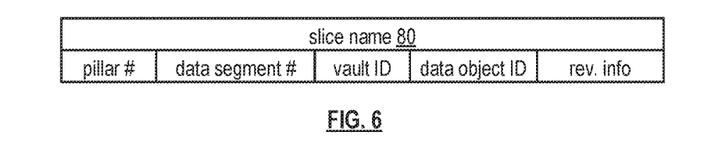
FIG. 6 is a schematic block diagram of an example of a slice name of an encoded data slice (EDS) in accordance with the present invention.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
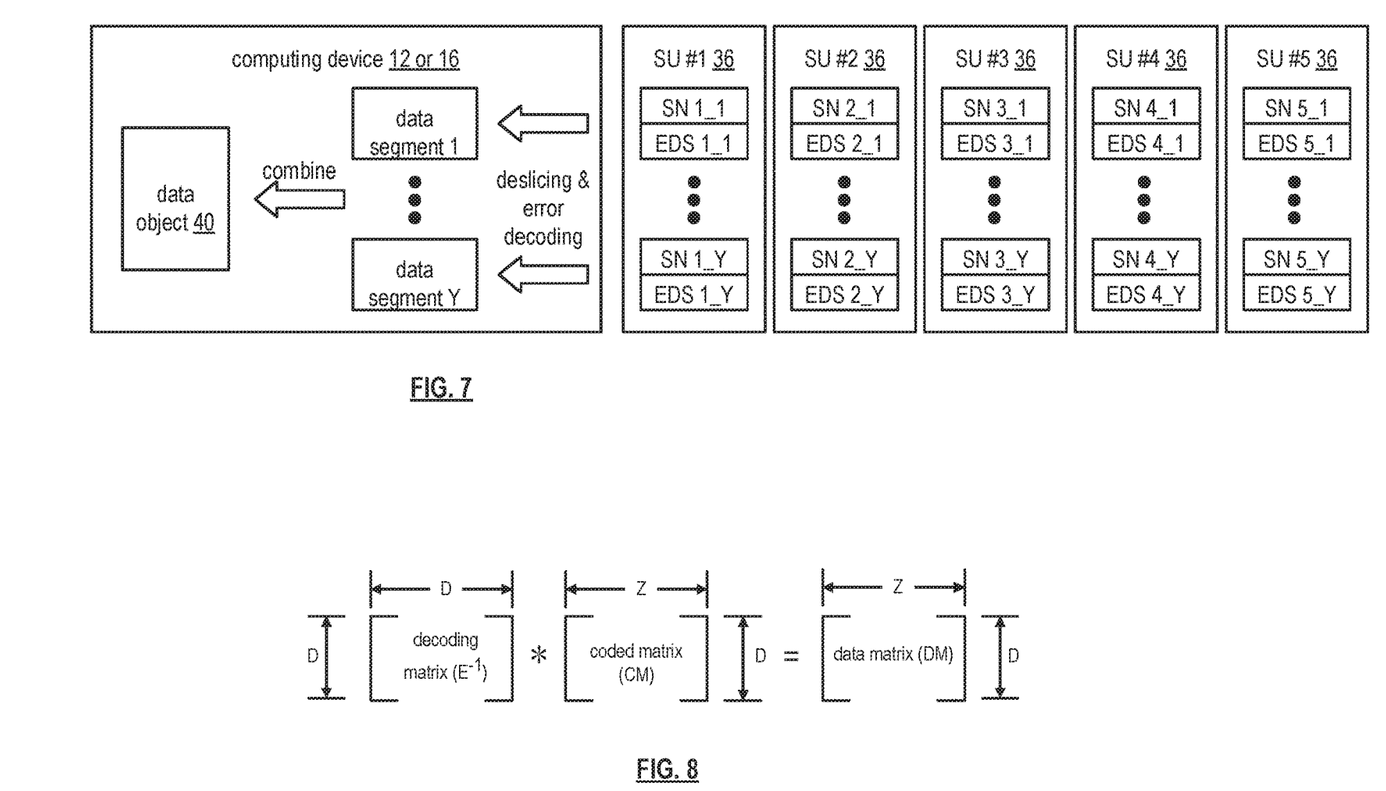
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
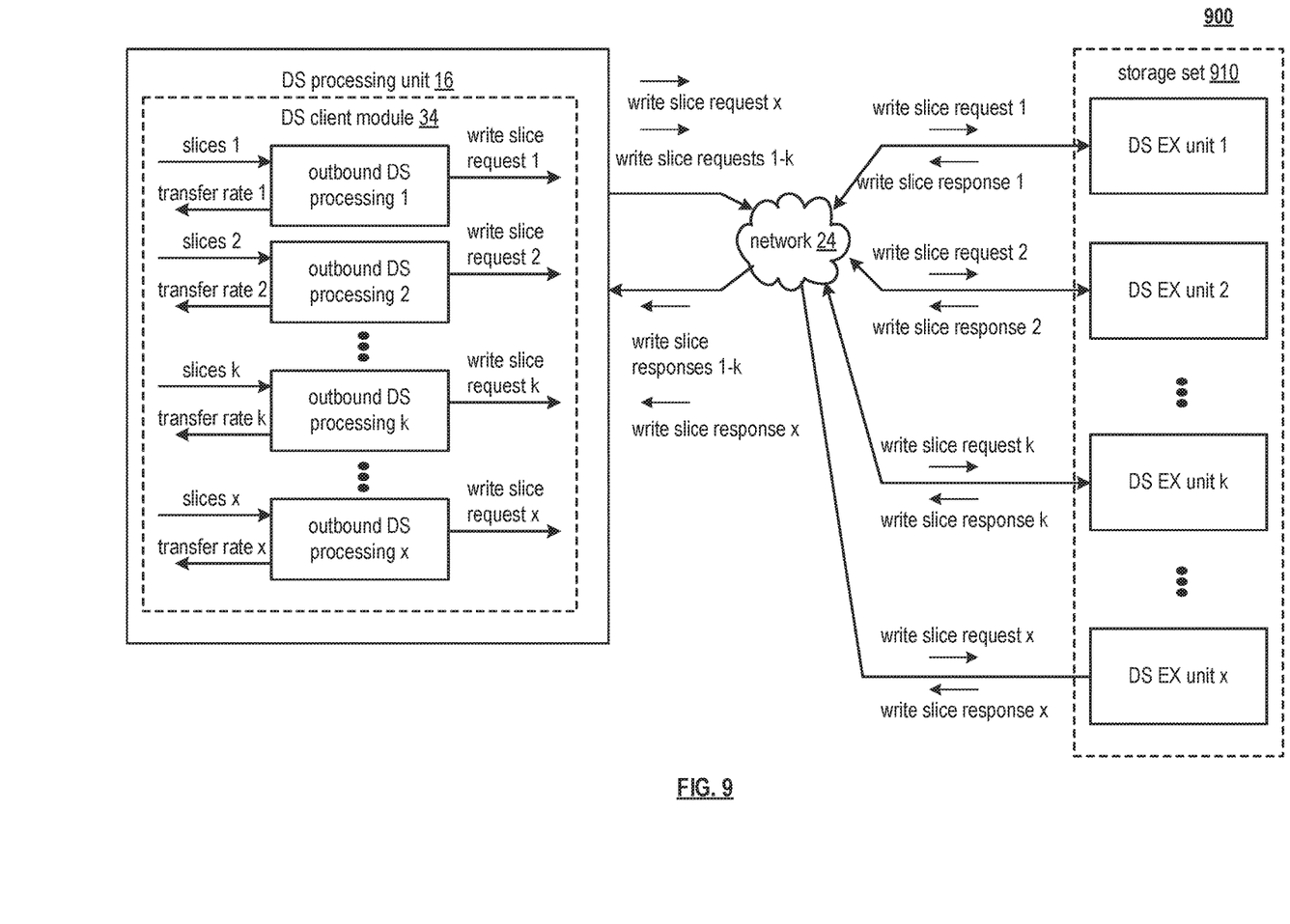
FIG. 9 is a schematic block diagram of an embodiment of a dispersed storage network (DSN) in accordance with the present invention.

FIG. 9 is a schematic block diagram of an embodiment 900 of a dispersed storage network (DSN) in accordance with the present invention. This diagram is a schematic block diagram of another embodiment of a dispersed storage network (DSN) that includes the DS processing unit (or computing device) 16 of FIG. 1, the network 24 of FIG. 1, and a storage set 910. The DS processing unit (or computing device) 16 includes the DS client module 34 of FIG. 1. The DS client module 34 includes one or more outbound DS processing 1-x, where each outbound DS processing may be implemented utilizing the outbound DS processing 80 of FIG. 3. The storage set 910 includes a set of DS execution (EX) units 1-x. Each DS execution unit may be implemented utilizing the DS execution unit 36 of FIG. 1. Hereafter, each DS execution unit may be interchangeably referred to as a storage unit and the storage set 910 may be interchangeably referred to as a set of storage units (SUs). The DSN functions to store data in the storage set 910.

In an example of operation of the storing of the data in the storage set, the plurality of outbound DS processing determines, for each storage unit of a group of storage units (e.g., a write threshold number), a slice transfer rate while sending, via the network 24, one or more sets of encoded data slices to the group of storage units for storage, where data is dispersed storage error encoded to produce the one or more sets of encoded data slices. The slice transfer rate includes a bits per second (bps) of measured transferring of encoded data slices. The determining includes one or more of measuring an outbound transfer rate, interpreting a time frame to receive a favorable write slice response to generate the transfer rate, and receiving the transfer rate from the storage unit. For example, the outbound DS processing 2 measures an outbound transfer rate of slices within a write slice request 2 to the DS execution unit 2 to produce a transfer rate 2 while receiving a favorable write slice response 2 of write slice responses 1-k.

For each slice transfer rate, each corresponding outbound DS processing (e.g., and/or the DS client module 34) determines whether the slice transfer rate compares favorably to a slice transfer rate threshold level. For example, the outbound DS processing 2 obtains the slice transfer rate 2, obtains the slice transfer rate threshold level based on at least one of a lookup and calculating as an average of at least some of the slice transfer rates, and indicates unfavorable when the slice transfer rate 2 is less than the slice transfer rate threshold level.

When the slice transfer rate compares unfavorably to the slice transfer rate threshold level, the DS client module 34 facilitates transfer of slices associated with the unfavorable slice transfer rate to another storage unit. The facilitating includes one or more of selecting the other storage unit (e.g., next on a list, based on an estimated performance level of the other storage unit) and issuing write slice requests to the selected other storage unit, where the requests includes the slices associated with the unfavorable slice transfer rate. For example, the outbound DS processing x selects the DS execution unit x as the other storage unit and issues, via the network 24, write slice requests x that includes slices 2 as slices x to the DS execution unit x and receives, via the network 24, a write slice response x from the DS execution unit x. Alternatively, or in addition to, the outbound DS processing 2 ceases transferring of encoded data slices 2 to the DS execution unit 2 when the transfer of the encoded data slices to the DS execution unit x has been established at a favorable transfer rate.

In an example, the DS processing unit (or computing device) 16 is in communication with a storage set 910 via network 24. The DS processing unit (or computing device) 16 includes an interface configured to interface and communicate with a dispersed storage network (DSN) that includes the storage set 910 (e.g., that may include a number of SUs), memory that stores operational instructions, and a processing module operably coupled to the interface and to the memory, wherein the processing module, when operable within the computing device based on the operational instructions, is configured to perform various functions.

In an example of operation and implementation, the DS processing unit (or computing device) 16 determines storage unit (SU)-based write transfer rates associated with each SU of a set of storage units (SUs) (e.g., storage set 910) within the storage set 910 and a DSN-based write transfer rate for a write request of a set of encoded data slices (EDSs) to the set of SUs (e.g., storage set 910) within the DSN. As is also described with respect to other diagrams herein (e.g., FIG. 3 among others), a data object is segmented into data segments, and a data segment thereof is dispersed error encoded in accordance with dispersed error encoding parameters to produce the set of EDSs that is of pillar width. A decode threshold number of EDSs are needed to recover the data segment, a read threshold number of EDSs provides for reconstruction of the data segment, and a write threshold number of EDSs provides for a successful transfer of the set of EDSs from a first at least one location in the DSN to a second at least one location in the DSN.

Referring again to the example of operation and implementation of the DS processing unit (or computing device) 16, when fewer than a first number of the SUs have corresponding SU-based write transfer rates that compare unfavorably to an acceptable SU-based write transfer rate and the DSN-based write transfer rate compares favorably to an acceptable DSN-based write transfer rate, the DS processing unit (or computing device) 16 issues an additional write request for at least one of the EDSs within the set of EDSs associated with the first number of the SUs to at least one additional SU within the DSN. In an example, when a relatively small number of SUs have respective SU-based write transfer rates that compare unfavorably to an acceptable SU-based write transfer rate (e.g., that do not meet with at least the acceptable SU-based write transfer rate) and yet if the DSN-based write transfer rate compares favorably to an acceptable DSN-based write transfer rate (e.g., at an acceptable rate within the DSN to maintain and provide good performance), then the DS processing unit (or computing device) 16 issues an additional write request for at least some of the EDSs.

An example of a relatively small number of SUs (e.g., fewer than a first number of the SUs) may include fewer than a pillar width number of SUs minus a write threshold number of SUs. Another example of a relatively small number of SUs (e.g., fewer than a first number of the SUs) may include fewer than the pillar width number of SUs minus a read threshold number of SUs. Note that different values for the first number of the SUs may be used at different times and based on different conditions.

An example of an acceptable SU-based write transfer rate is a value that maintains and provides good performance within the DSN on a per-SU basis (e.g., in terms of X write transfers number second, where X is some predetermined, adaptively determined, prior stored, etc. value greater than zero). An example of acceptable DSN-based write transfer rate is one that maintains and provides good performance across the DSN in general in terms of network traffic speeds (e.g., in terms of Y write transfers number second, where Y is some predetermined, adaptively determined, prior stored, etc. value greater than zero).

Referring again to the example of operation and implementation of the DS processing unit (or computing device) 16, when more than a second number of the SUs have corresponding SU-based write transfer rates that compare favorably to the acceptable SU-based write transfer rate and the DSN-based write transfer rate compares unfavorably to the acceptable DSN-based write transfer rate, the DS processing unit (or computing device) 16 increases a time interval between write requests of sets of EDSs to the SUs within the DSN. For example, this may correspond to a situation where operation of write transfers within the DSN are to slowed down generally.

An example of the second number of the SUs may include at least the write threshold number of SUs or at least the read threshold number of SUs within the plurality of SUs. In some examples, note that the read threshold number and write threshold number may be the same, though the write threshold number may be larger than the read threshold number in other examples. For example, when the dispersed error encoding parameters are based on a 10×16 dispersed error encoding system, the pillar width is 16, and the decode threshold number of EDSs is 10. The read threshold number of EDSs may be greater than or equal to the decode threshold number of EDSs and less than 16 (e.g., 11, 12, or 13), and the write threshold number of EDSs may be greater than or equal to the read threshold number of EDSs and less than 16 (e.g., 13, 14, or 15). For another example, when the dispersed error encoding parameters are based on a 3×5 dispersed error encoding system, the pillar width is 5, and the decode threshold number of EDSs is 3. The read threshold number of EDSs may be greater than or equal to the decode threshold number of EDSs and less than 5 (e.g., 4), and the write threshold number of EDSs is greater than or equal to the read threshold number of EDSs and less than 5 (e.g., 4).

Referring again to the example of operation and implementation of the DS processing unit (or computing device) 16, when fewer than the first number of the SUs have corresponding SU-based write transfer rates that compare unfavorably to the acceptable SU-based write transfer rate and the DSN-based write transfer rate compares unfavorably to the acceptable DSN-based write transfer rate, the DS processing unit (or computing device) 16 both issues the additional write request for the at least one of the EDSs within the set of EDSs associated with the first number of the SUs to the at least one additional SU within the DSN and also increases the time interval between the write requests of the sets of EDSs to the SUs within the DSN. For example, this may correspond to a situation where more than an acceptable number of SUs do not operate in accordance with of better than the acceptable SU-based write transfer rate and also correspond to a situation where operation of write transfers within the DSN are to slowed down generally.

In another example of operation, when more than the second number of the SUs have corresponding SU-based write transfer rates that compare unfavorably to the acceptable SU-based write transfer rate, prohibits any other write request of the set of EDSs to the SUs within the DSN. For example, this may correspond to a situation where the DS processing unit (or computing device) 16 ensures that no additional write request is issued to allow ample opportunity and time for the original write request to complete.

In another example of operation, the DS processing unit (or computing device) 16 receives write responses from the SUs (e.g., of the storage set 910) based on the write request of the set of EDSs to the SUs within the DSN, and each write response is received from a respective one of the SUs in response to the write request of the set of EDSs to the SUs within the DSN (e.g., one write response is provided respectively from each SU). The DS processing unit (or computing device) 16 then determines SU-based write transfer rates for the SUs within the DSN, and the SU-based write transfer rates correspond to the SUs one a one-to-one basis (e.g., each SU-based write transfer rate corresponds to one SU of the SUs). The DS processing unit (or computing device) 16 then identifies at least one of the first number of the SUs have corresponding SU-based write transfer rates that compare unfavorably to the acceptable SU-based write transfer rate and/or the second number of the SUs have corresponding SU-based write transfer rates that compare favorably to the acceptable SU-based write transfer rate based on the SU-based write transfer rates for the SUs within the DSN.

In another example of operation, the DS processing unit (or computing device) 16 detects a change of the SU-based write transfer rates associated with at least one of the SUs and/or the DSN-based write transfer rate for at least one of the write request of the set of EDSs (or another write request of another set of EDSs) to the SUs within the DSN. Based on detecting that change, the DS processing unit (or computing device) 16 modifies the time interval between write requests of sets of EDSs to the SUs within the DSN.

Note that the DS processing unit (or computing device) 16 may be any type of devices as described herein including a SU of the SUs (e.g., within the storage set 910) within the DSN, a wireless smart phone, a laptop, a tablet, a personal computers (PC), a work station, or a video game device. Note also that the DSN may be implemented to include any of a variety of different types of communication systems including a wireless communication system, a wire lined communication systems, a non-public intranet system, a public internet system, a local area network (LAN), and/or a wide area network (WAN), and/or any other type of communication system without departing from the scope and spirit of the invention.

Figure 10A:
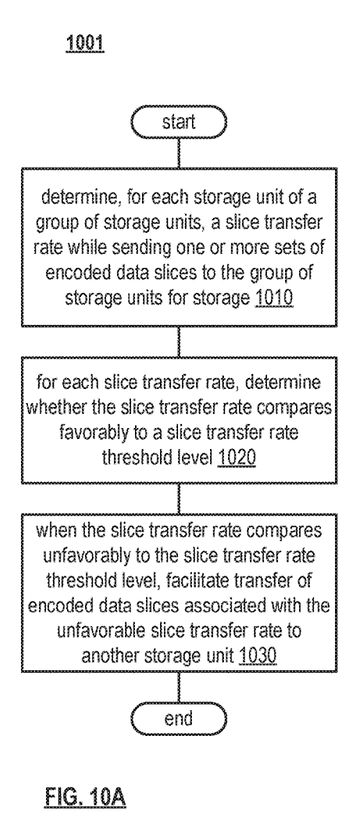
FIG. 10A is a diagram illustrating an embodiment of a method for execution by one or more computing devices in accordance with the present invention.

FIG. 10A is a diagram illustrating an embodiment of a method 1001 for execution by one or more computing devices in accordance with the present invention. This diagram depicts operations associated with storing data. The method begins or continues at a step 1010 where a processing module of a DS processing unit (or computing device) determines, for each storage unit of a group of storage units, a slice transfer rate while sending one or more sets of encoded data slices to the group of storage units for storage. The determining includes one or more of measuring outbound transfer rates, interpreting time frames to receive a favorable write slice response, and receiving from the storage units.

For each slice transfer rate, the method continues at a step 1020 where the processing module determines whether the slice transfer rate compares favorably to a slice transfer rate threshold level. For example, the processing module obtains the slice transfer rate threshold level based on at least one of a lookup and calculating as an average of at least some of the slice transfer rates, and indicates unfavorable when the comparison indicates that the slice transfer rate is less than the slice transfer rate threshold level.

When the slice transfer rate compares unfavorably to the slice transfer rate threshold level, the method continues at a step 1030 where the processing module facilitates transfer of encoded data slices associated with the unfavorable slice transfer rate to another storage unit. The facilitating includes one or more of selecting the other storage unit, and issuing write slice requests to the selected other storage unit, where the requests includes the slices associated with the unfavorable slice transfer rate. Alternatively, or in addition to, the processing module may cease transferring slices to the storage unit associated with the unfavorable slice transfer rate when a favorable transfer rate of slices has been established to the selected other storage unit.

Figure 10B:
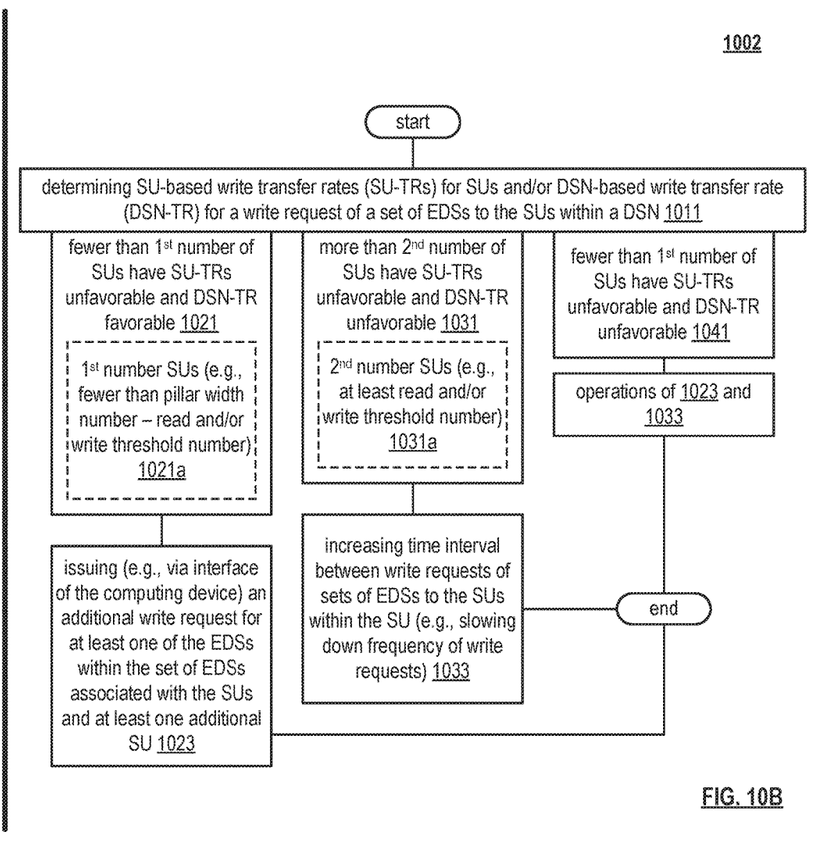
FIG. 10B is a diagram illustrating another embodiment of a method for execution by one or more computing devices in accordance with the present invention.

FIG. 10B is a diagram illustrating another embodiment of a method 1002 for execution by one or more computing devices in accordance with the present invention. The method 1002 begins in step 1011 by determining storage unit (SU)-based write transfer rates associated with each SU of a group of storage units (SUs) (e.g., a storage set of SUs) and a DSN-based write transfer rate for a write request of a set of encoded data slices (EDSs) to the SUs within a dispersed storage network (DSN). Note that a data object is segmented into data segments, and a data segment of the data segments is dispersed error encoded in accordance with dispersed error encoding parameters to produce the set of EDSs that is of pillar width. A decode threshold number of EDSs are needed to recover the data segment, a read threshold number of EDSs provides for reconstruction of the data segment, and a write threshold number of EDSs provides for a successful transfer of the set of EDSs from a first at least one location in the DSN to a second at least one location in the DSN.

When fewer than a first number of the SUs have corresponding SU-based write transfer rates that compare unfavorably to an acceptable SU-based write transfer rate and the DSN-based write transfer rate compares favorably to an acceptable DSN-based write transfer rate as determined in step 1021, the method 1002 operates in step 1023 by issuing (e.g., via an interface of the computing device implemented to interface and communicate with the DSN) an additional write request for at least one of the EDSs within the set of EDSs associated with the first number of the SUs to at least one additional SU within the DSN. In an example, the first number of the SUs includes fewer than a pillar width number of SUs within the SUs minus a write (and/or read) threshold number of SUs within the SUs as shown in step 1021a.

When more than a second number of the SUs have corresponding SU-based write transfer rates that compare favorably to the acceptable SU-based write transfer rate and the DSN-based write transfer rate compares unfavorably to the acceptable DSN-based write transfer rate as determined in step 1021, the method 1002 operates in step 1023 by increasing a time interval between write requests of sets of EDSs to the SUs within the DSN. In an example, the second number of the SUs includes at least the write (and/or read) threshold number of SUs within the SUs as shown in step 1031a.

When fewer than the first number of the SUs have corresponding SU-based write transfer rates that compare unfavorably to the acceptable SU-based write transfer rate and the DSN-based write transfer rate compares unfavorably to the acceptable DSN-based write transfer rate as determined in step 1041, the method 1002 operates by performing both the operations of the steps 1023 and 1033 (e.g., issuing, such as via the interface of the computing device implemented to interface and communicate with the DSN, the additional write request for the at least one of the EDSs within the set of EDSs associated with the first number of the SUs to the at least one additional SU within the DSN and also increasing the time interval between the write requests of the sets of EDSs to the SUs within the DSN).

Figure 11A:
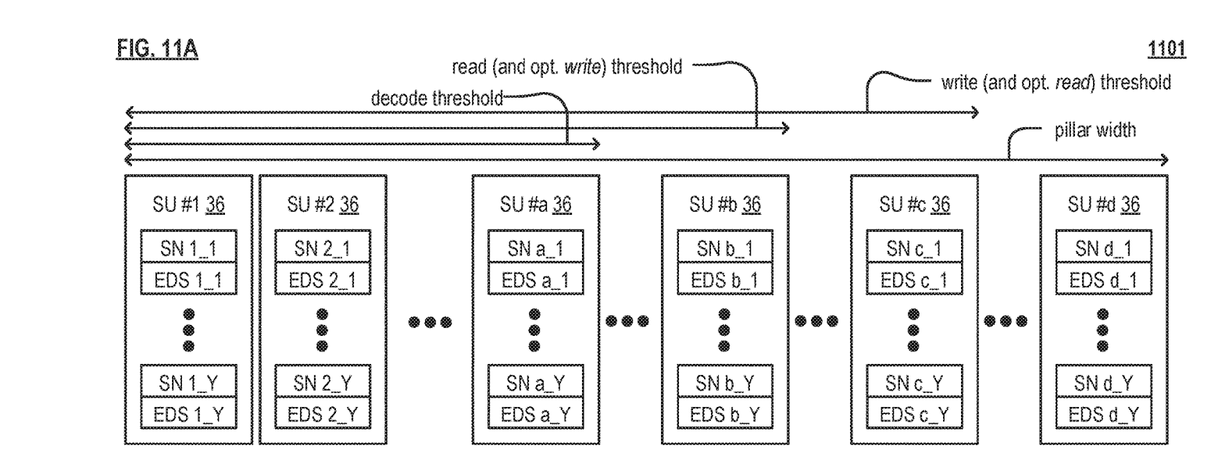
FIG. 11A is a schematic block diagram of an example of various parameters associated with a set of encoded data slices (EDSs) stored within storage units (SUs) in accordance with the present invention.

FIG. 11A is a schematic block diagram of an example 1101 of various parameters associated with a set of encoded data slices (EDSs) stored within storage units (SUs) in accordance with the present invention. This diagram shows generally the relationship between a pillar width number of SUs (and/or EDSs), a decode threshold number of SUs (and/or EDSs), a read threshold number of SUs (and/or EDSs), and a write threshold number of SUs (and/or EDSs). When considering such numbers with respect to EDSs, note that a data object is segmented into data segments, and a data segment of the plurality of data segments is dispersed error encoded in accordance with dispersed error encoding parameters to produce the set of EDSs that is of pillar width. A decode threshold number of EDSs are needed to recover the data segment, a read threshold number of EDSs provides for reconstruction of the data segment, and a write threshold number of EDSs provides for a successful transfer of the set of EDSs from a first at least one location in the DSN to a second at least one location in the DSN. Note also that the read threshold number and the write threshold number may be the same in certain examples and based on certain dispersed error encoding parameters. In general, the read threshold number is greater than the decode threshold number. Also, the write threshold number is generally greater than the read threshold number and less than the pillar width.

Various numbers may be selected based on any of these numbers as described with respect to this diagram. For example, with respect to a first number of the plurality of SUs as described herein, the first number may be the pillar width number minus the write threshold number. Alternatively, the first number of the plurality of SUs, the first number may be the pillar width number minus the read threshold number. In even other examples, the first number of the plurality of SUs, the first number may be the pillar width number minus the decode threshold number. In addition, with respect to the second number of the plurality of SUs as described herein, the second number may be at least the write threshold number or at least the read threshold number in various examples. Note that different respective values may be used for the first number of the plurality of SUs and the second number of the plurality of SUs at different times and based on different considerations. For example, the first number of the plurality of SUs and/or the second number of the plurality of SUs may be adapted, modified, adjusted, etc. to be any of the various numbers as described with respect to this diagram at different times and based on different considerations.

Figure 11B:
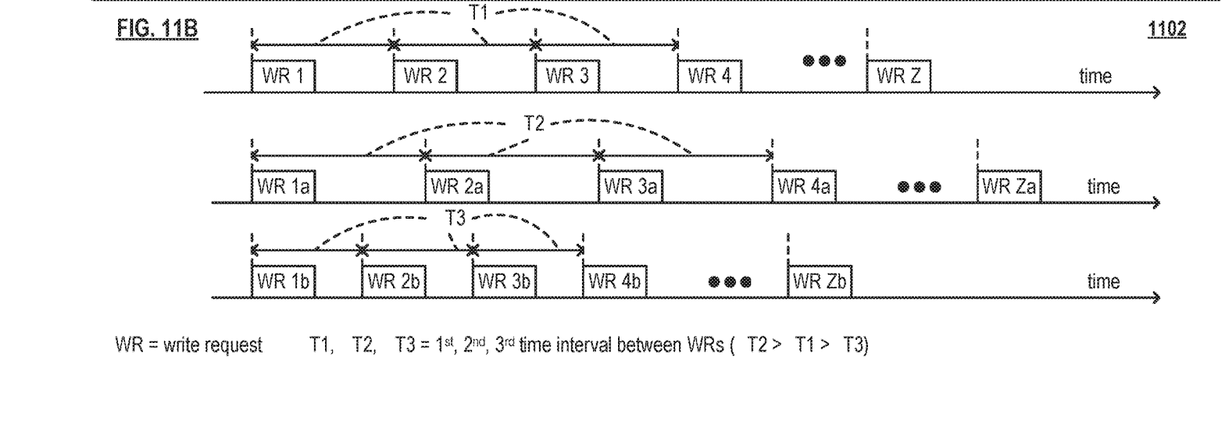
FIG. 11B is a schematic block diagram of an example of write request time intervals in accordance with the present invention.

FIG. 11B is a schematic block diagram of an example 1102 of write request time intervals in accordance with the present invention. Different respective write requests (WRs) (e.g., for different respective sets of EDSs) are shown as being performed at particular time intervals along different respective time axes. For example, in the top axis, the WRs (e.g., WR 1, WR2, and so on) are performed at respective times separated by a time interval, T1. In the middle axis, the WRs (e.g., WR 1a, WR 2a, and so on) are performed at respective times separated by a time interval, T2, which is longer than the time interval, T1. In the bottom axis, the WRs (e.g., WR 1b, WR2b, and so on) are performed at respective times separated by a time interval, T3, which is shorter than the time interval, T1. Note that a DS processing unit (or computing device) 16 may adapt the time interval between the write requests of the sets of EDSs to the SUs within the DSN based on various considerations including the SU-based write transfer rates associated with the SUs and the DSN-based write transfer rate (e.g., and their comparisons to one of more acceptable rates). Note that the different respective time intervals between the write requests of the sets of EDSs to the SUs within the DSN may be used successively to one another in some examples.

Various aspects of the invention may be understood also with respect to a feature referred to as pessimistic writes that may be is used to determine when to issue additional write requests to alternate storage locations (e.g., such as when using target widths, trimmed writes, or other write strategies where the number of slices or EDSs to be written and persisted is less than the number of possible storage locations). For example, this determination may be made when it is determined to be probable that a write request will fail, or when a determination is that it will take so long to complete that a newly issued write request to a new ds unit will complete faster than the already initiated write request. The normal strategy for triggering a pessimistic write is when a write takes much longer to complete than normal. However, there are two important conditions worth discriminating between, for in one, it does make sense to issue new write requests, while in the other issuing new write requests is the worst thing to do. When the write request takes longer than expected due to an issue with the ds unit in question, it makes sense to issue a new slice to a different ds unit. However, when the request takes longer than expected due to a local problem affecting the DS processing unit, or its network connection, then issuing new write requests will only slow down everything within the DSN more. To determine whether it is a DS processing unit error or a local DS processing unit error, the DS processing unit may then compare the relative request time to other request times issued to other DS processing units at the same point in time (and/or to an acceptable SU-based write transfer rate and/or an acceptable DSN-based write transfer rate). Another mechanism is to monitor the rate of transfer occurring between itself and other DS processing units at the time. When the slowdown appears to be global (or at least affecting a majority of the ds units) then the DS processing unit may determine that it is a local slowdown and therefore not issue new write requests. However, when the DS processing unit sees that most requests are proceeding at normal or historical transfer rates, the DS processing unit may determine the slowdown is isolated to one or more of the slowly processing DS processing units, and therefore issue new write requests.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A computing device comprising:
an interface configured to interface and communicate with a dispersed storage network (DSN);
memory that stores operational instructions; and
a processing module operably coupled to the interface and to the memory, wherein the processing module, when operable within the computing device based on the operational instructions, is configured to:
determine storage unit (SU)-based write transfer rates associated with each of a plurality of storage units (SUs) and a DSN-based write transfer rate while sending a write request of a set of encoded data slices (EDSs) to the plurality of SUs within the DSN, wherein a data object is segmented into a plurality of data segments, wherein a data segment of the plurality of data segments is dispersed error encoded in accordance with dispersed error encoding parameters to produce the set of EDSs that is of pillar width, wherein a decode threshold number of EDSs are needed to recover the data segment, wherein a read threshold number of EDSs provides for reconstruction of the data segment, wherein a write threshold number of EDSs provides for a successful transfer of the set of EDSs from a first at least one location in the DSN to a second at least one location in the DSN;
when fewer than a first number of the plurality of SUs have corresponding SU-based write transfer rates that compare unfavorably to an acceptable SU-based write transfer rate and the DSN-based write transfer rate compares favorably to an acceptable DSN-based write transfer rate, issue an additional write request for at least one of the EDSs within the set of EDSs associated with the first number of the plurality of SUs to at least one additional SU within the DSN;
when more than a second number of the plurality of SUs have corresponding SU-based write transfer rates that compare favorably to the acceptable SU-based write transfer rate and the DSN-based write transfer rate compares unfavorably to the acceptable DSN-based write transfer rate, increase a time interval between write requests of sets of EDSs to the plurality of SUs within the DSN; and when fewer than the first number of the plurality of SUs have corresponding SU-based write transfer rates that compare unfavorably to the acceptable SU-based write transfer rate and the DSN-based write transfer rate compares unfavorably to the acceptable DSN-based write transfer rate, issue the additional write request for the at least one of the EDSs within the set of EDSs associated with the first number of the plurality of SUs to the at least one additional SU within the DSN and increase the time interval between the write requests of the sets of EDSs to the plurality of SUs within the DSN.

2. The computing device of claim 1, wherein the processing module, when operable within the computing device based on the operational instructions, is further configured to:

when more than the second number of the plurality of SUs have corresponding SU-based write transfer rates that compare unfavorably to the acceptable SU-based write transfer rate, prohibit any other write request of the set of EDSs to the plurality of SUs within the DSN.

3. The computing device of claim 1, wherein the processing module, when operable within the computing device based on the operational instructions, is further configured to:

receive a plurality of write responses from the plurality of SUs based on the write request of the set of EDSs to the plurality of SUs within the DSN, wherein each write response is received from a respective one of the plurality of SUs in response to the write request of the set of EDSs to the plurality of SUs within the DSN;

determine a plurality of SU-based write transfer rates for the plurality of SUs within the DSN, wherein the plurality of SU-based write transfer rates correspond to the plurality of SUs one a one-to-one basis; and identify at least one of the first number of the plurality of SUs have corresponding SU-based write transfer rates that compare unfavorably to the acceptable SU-based write transfer rate or the second number of the plurality of SUs have corresponding SU-based write transfer rates that compare favorably to the acceptable SU-based write transfer rate based on the plurality of SU-based write transfer rates for the plurality of SUs within the DSN.

4. The computing device of claim 1, wherein the processing module, when operable within the computing device based on the operational instructions, is further configured to:

detect a change of at least one of the SU-based write transfer rates associated with at least one of the plurality of SUs or the DSN-based write transfer rate for at least one of the write request of the set of EDSs or another write request of another set of EDSs to the plurality of SUs within the DSN; and modify the time interval between write requests of sets of EDSs to the plurality of SUs within the DSN based on the change that is detected.

5. The computing device of claim 1, wherein:
the first number of the plurality of SUs includes fewer than a pillar width number of SUs within the plurality of SUs minus a write threshold number of SUs within the plurality of SUs; and
the second number of the plurality of SUs includes at least the write threshold number of SUs within the plurality of SUs.

6. The computing device of claim 1, wherein:
the first number of the plurality of SUs includes fewer than a pillar width number of SUs within the plurality of SUs minus a read threshold number of SUs within the plurality of SUs; and
the second number of the plurality of SUs includes at least the read threshold number of SUs within the plurality of SUs.

7. The computing device of claim 1, wherein:
the dispersed error encoding parameters are based on a 10×16 dispersed error encoding system;
the pillar width is 16;
the decode threshold number of EDSs is 10;
the read threshold number of EDSs is greater than or equal to the decode threshold number of EDSs and less than 16; and
the write threshold number of EDSs is greater than or equal to the read threshold number of EDSs and less than 16.

8. The computing device of claim 1, wherein:
the dispersed error encoding parameters are based on a 3×5 dispersed error encoding system;
the pillar width is 5;
the decode threshold number of EDSs is 3;
the read threshold number of EDSs is greater than or equal to the decode threshold number of EDSs and less than 5; and
the write threshold number of EDSs is greater than or equal to the read threshold number of EDSs and less than 5.

9. The computing device of claim 1 further comprising:
a SU of the plurality of SUs within the DSN, a wireless smart phone, a laptop, a tablet, a personal computers (PC), a work station, or a video game device.

10. The computing device of claim 1, wherein the DSN includes at least one of a wireless communication system, a wire lined communication system, a non-public intranet system, a public internet system, a local area network (LAN), or a wide area network (WAN).

11. A method for execution by a computing device, the method comprising:
determining storage unit (SU)-based write transfer rates associated with each of a plurality of storage units (SUs) and a DSN-based write transfer rate while sending a write request of a set of encoded data slices (EDSs) to the plurality of SUs within a dispersed storage network (DSN), wherein a data object is segmented into a plurality of data segments, wherein a data segment of the plurality of data segments is dispersed error encoded in accordance with dispersed error encoding parameters to produce the set of EDSs that is of pillar width, wherein a decode threshold number of EDSs are needed to recover the data segment, wherein a read threshold number of EDSs provides for reconstruction of the data segment, wherein a write threshold number of EDSs provides for a successful transfer of the set of EDSs from a first at least one location in the DSN to a second at least one location in the DSN;

when fewer than a first number of the plurality of SUs have corresponding SU-based write transfer rates that compare unfavorably to an acceptable SU-based write transfer rate and the DSN-based write transfer rate compares favorably to an acceptable DSN-based write transfer rate, issuing, via an interface of the computing device implemented to interface and communicate with the DSN, an additional write request for at least one of the EDSs within the set of EDSs associated with the first number of the plurality of SUs to at least one additional SU within the DSN;

when more than a second number of the plurality of SUs have corresponding SU-based write transfer rates that compare favorably to the acceptable SU-based write transfer rate and the DSN-based write transfer rate compares unfavorably to the acceptable DSN-based write transfer rate, increasing a time interval between write requests of sets of EDSs to the plurality of SUs within the DSN; and when fewer than the first number of the plurality of SUs have corresponding SU-based write transfer rates that compare unfavorably to the acceptable SU-based write transfer rate and the DSN-based write transfer rate compares unfavorably to the acceptable DSN-based write transfer rate, issuing, via the interface of the computing device implemented to interface and communicate with the DSN, the additional write request for the at least one of the EDSs within the set of EDSs associated with the first number of the plurality of SUs to the at least one additional SU within the DSN and increasing the time interval between the write requests of the sets of EDSs to the plurality of SUs within the DSN.

12. The method of claim 11 further comprising:
when more than the second number of the plurality of SUs have corresponding SU-based write transfer rates that compare unfavorably to the acceptable SU-based write transfer rate, prohibiting any other write request of the set of EDSs to the plurality of SUs within the DSN.

13. The method of claim 11 further comprising:
receiving a plurality of write responses from the plurality of SUs based on the write request of the set of EDSs to the plurality of SUs within the DSN, wherein each write response is received from a respective one of the plurality of SUs in response to the write request of the set of EDSs to the plurality of SUs within the DSN;
determining a plurality of SU-based write transfer rates for the plurality of SUs within the DSN, wherein the plurality of SU-based write transfer rates correspond to the plurality of SUs one a one-to-one basis; and
identifying at least one of the first number of the plurality of SUs have corresponding SU-based write transfer rates that compare unfavorably to the acceptable SU-based write transfer rate or the second number of the plurality of SUs have corresponding SU-based write transfer rates that compare favorably to the acceptable SU-based write transfer rate based on the plurality of SU-based write transfer rates for the plurality of SUs within the DSN.

14. The method of claim 11 further comprising:
detecting a change of at least one of the SU-based write transfer rates associated with at least one of the plurality of SUs or the DSN-based write transfer rate for at least one of the write request of the set of EDSs or another write request of another set of EDSs to the plurality of SUs within the DSN; and
modifying the time interval between write requests of sets of EDSs to the plurality of SUs within the DSN based on the change that is detected.

15. The method of claim 11, wherein:
the first number of the plurality of SUs includes fewer than a pillar width number of SUs within the plurality of SUs minus a write threshold number of SUs within the plurality of SUs; and
the second number of the plurality of SUs includes at least the write threshold number of SUs within the plurality of SUs.

16. The method of claim 11, wherein:
the first number of the plurality of SUs includes fewer than a pillar width number of SUs within the plurality of SUs minus a read threshold number of SUs within the plurality of SUs; and
the second number of the plurality of SUs includes at least the read threshold number of SUs within the plurality of SUs.

17. The method of claim 11, wherein:
the dispersed error encoding parameters are based on a 10×16 dispersed error encoding system;
the pillar width is 16;
the decode threshold number of EDSs is 10;
the read threshold number of EDSs is greater than or equal to the decode threshold number of EDSs and less than 16; and
the write threshold number of EDSs is greater than or equal to the read threshold number of EDSs and less than 16.

18. The method of claim 11, wherein:
the dispersed error encoding parameters are based on a 3×5 dispersed error encoding system;
the pillar width is 5;
the decode threshold number of EDSs is 3;
the read threshold number of EDSs is greater than or equal to the decode threshold number of EDSs and less than 5; and
the write threshold number of EDSs is greater than or equal to the read threshold number of EDSs and less than 5.

19. The method of claim 11, wherein the computing device includes a SU of the plurality of SUs within the DSN, a wireless smart phone, a laptop, a tablet, a personal computers (PC), a work station, or a video game device.

20. The method of claim 11, wherein the DSN includes at least one of a wireless communication system, a wire lined communication system, a non-public intranet system, a public internet system, a local area network (LAN), or a wide area network (WAN).

* * * * *